United States Patent
Vishwanath et al.

(10) Patent No.: US 11,088,699 B1
(45) Date of Patent: Aug. 10, 2021

(54) PIECEWISE COMPENSATION METHOD FOR ULTRA-LOW TEMPERATURE DRIFT

(71) Applicant: Texas Instruments Incorporated, Dallas, TX (US)

(72) Inventors: Tallam Vishwanath, Bangalore (IN); Sandeep Shylaja Krishnan, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/894,509

(22) Filed: Jun. 5, 2020

(51) Int. Cl.
*H03M 1/06* (2006.01)
*H03K 3/03* (2006.01)
*H03K 3/011* (2006.01)

(52) U.S. Cl.
CPC .............. *H03M 1/06* (2013.01); *H03K 3/011* (2013.01); *H03K 3/0315* (2013.01)

(58) Field of Classification Search
CPC ........ H03M 1/06; H03K 3/011; H03K 3/0315
See application file for complete search history.

(56) References Cited

U.S. PATENT DOCUMENTS

| | | | |
|---|---|---|---|
| 6,614,305 B1 | 9/2003 | Ivanov et al. | |
| 7,710,190 B2 | 5/2010 | Oberhuber | |
| 10,274,982 B2 * | 4/2019 | Kadanka | G05F 1/468 |
| 10,599,176 B1 * | 3/2020 | He | G05F 3/262 |
| 10,680,504 B2 * | 6/2020 | Kawano | H02M 3/156 |
| 10,684,637 B2 * | 6/2020 | Yoshida | G05F 1/465 |
| 10,838,443 B2 * | 11/2020 | Rasmus | G05F 1/463 |
| 10,838,448 B1 * | 11/2020 | Yadala | G05F 3/26 |
| 10,848,175 B2 * | 11/2020 | Doorenbos | H03M 3/38 |
| 2018/0239383 A1 | 8/2018 | Parakh et al. | |

OTHER PUBLICATIONS

R. Oberhuber, R. Prakash and V. Ivanov, "A 1 ppm/° C. bandgap voltage reference with new second-order Taylor curvature compensation," 23rd IEEE International SOC Conference, Las Vegas, NV, 2010, pp. 71-76, doi: 10.1109/SOCC.2010.5784635.

"REF34xx Low-Drift, Low-Power, Small-Footprint Series Voltage Reference", Texas Instruments, REF3425, REF3430, REF3433, REF3440, REF3450, SBAS804B—Sep. 2017—Revised Mar. 2018, 29 pgs.

* cited by examiner

*Primary Examiner* — Brian K Young
(74) *Attorney, Agent, or Firm* — Michelle F. Murray; Charles A. Brill; Frank D. Cimino

(57) ABSTRACT

An electronic device includes a bandgap reference circuit having an output, and a bias input; a piecewise compensation circuit having an output coupled to the bias input, and an input; and a piecewise compensation current generator having an output coupled to the input of the piecewise compensation circuit, and a knee point temperature adjustment circuit coupled to the output of the piecewise compensation current generator.

20 Claims, 12 Drawing Sheets

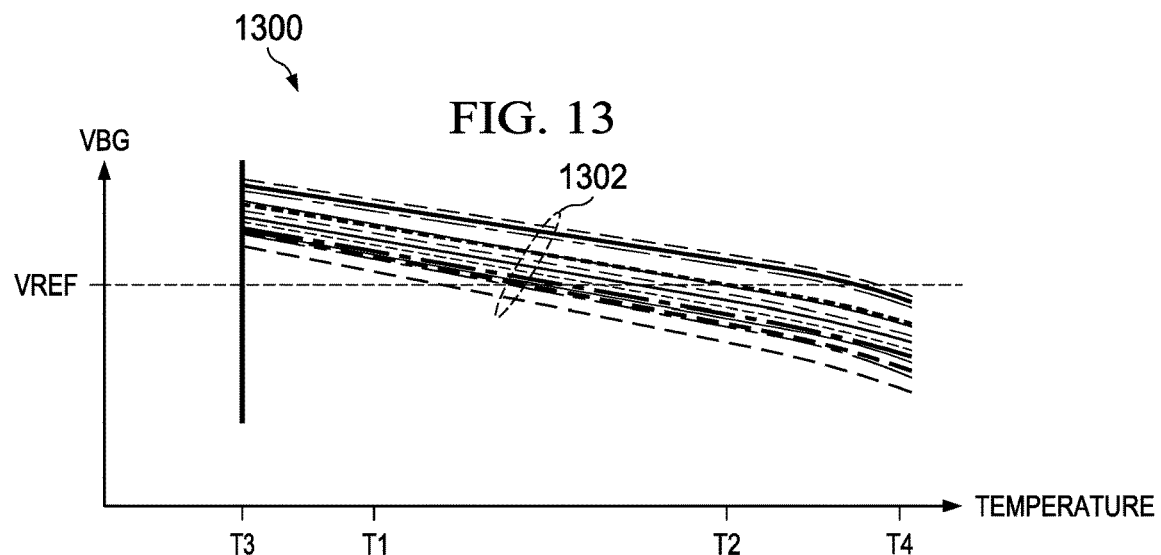
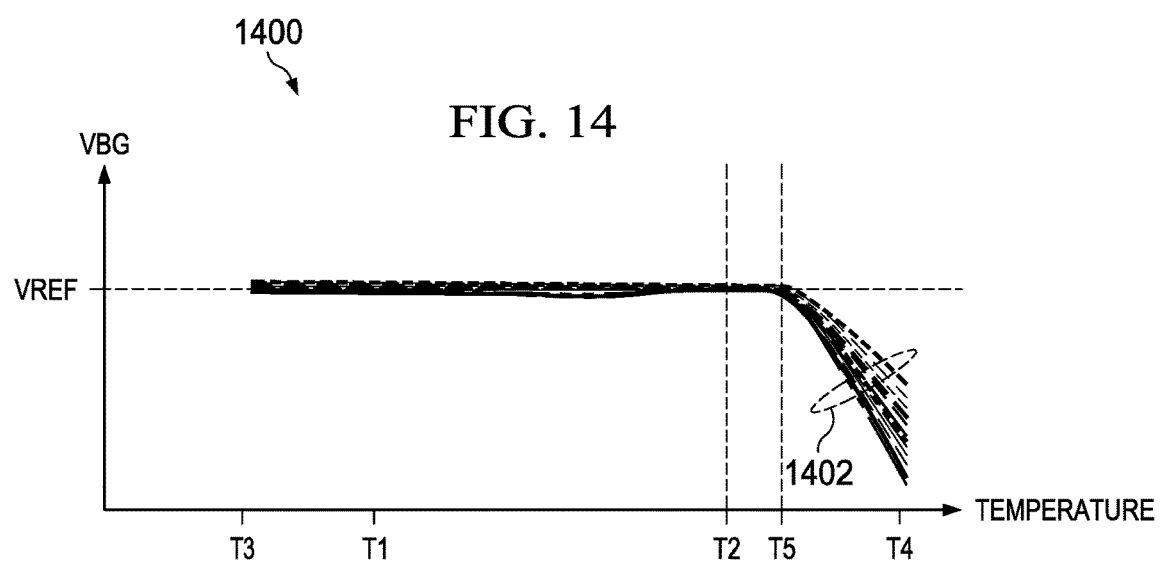
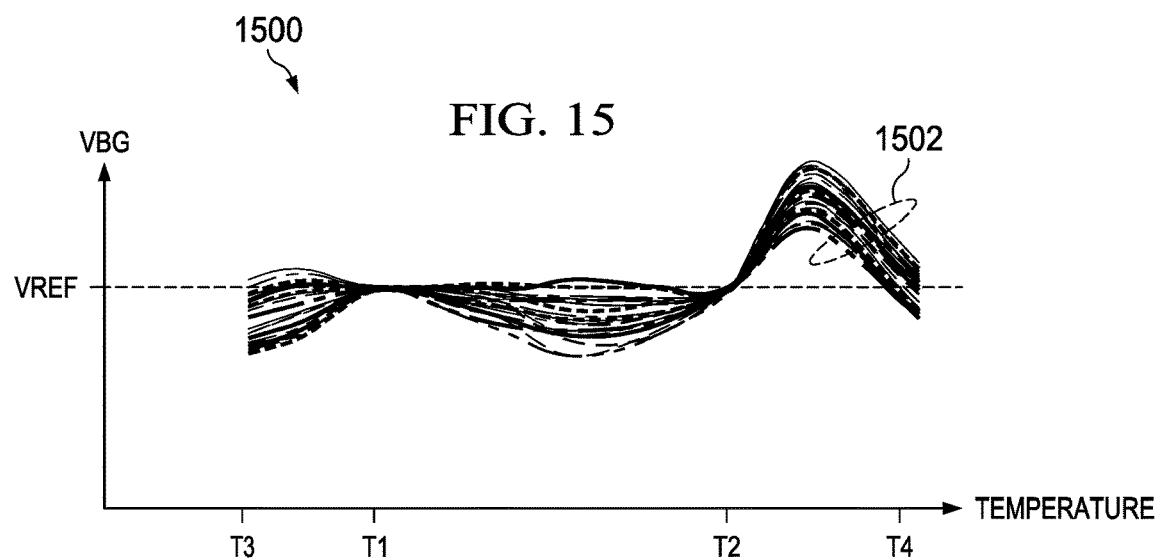

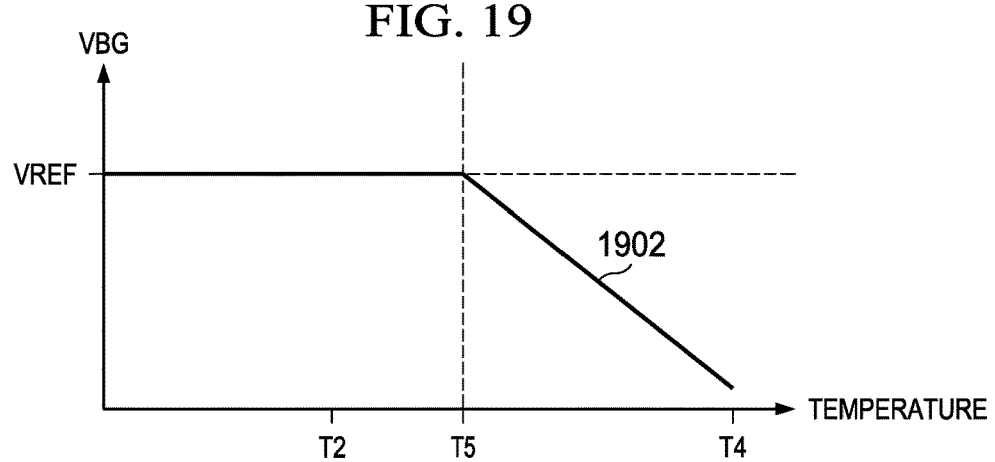
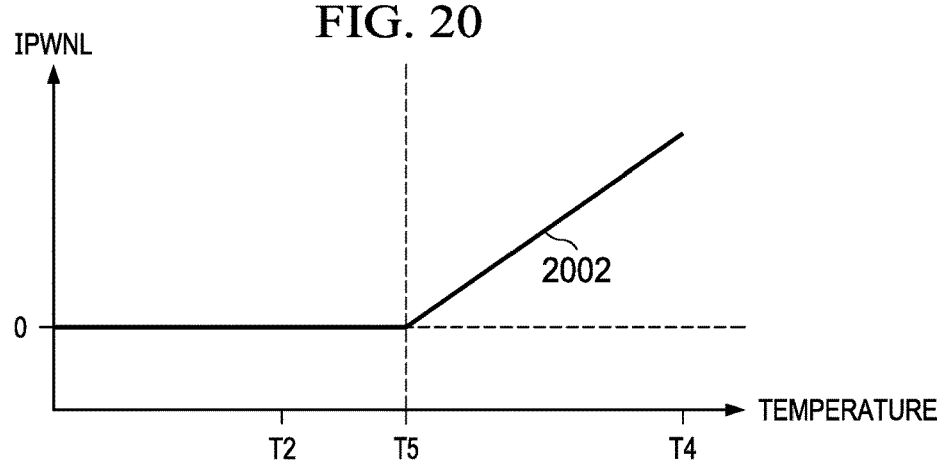
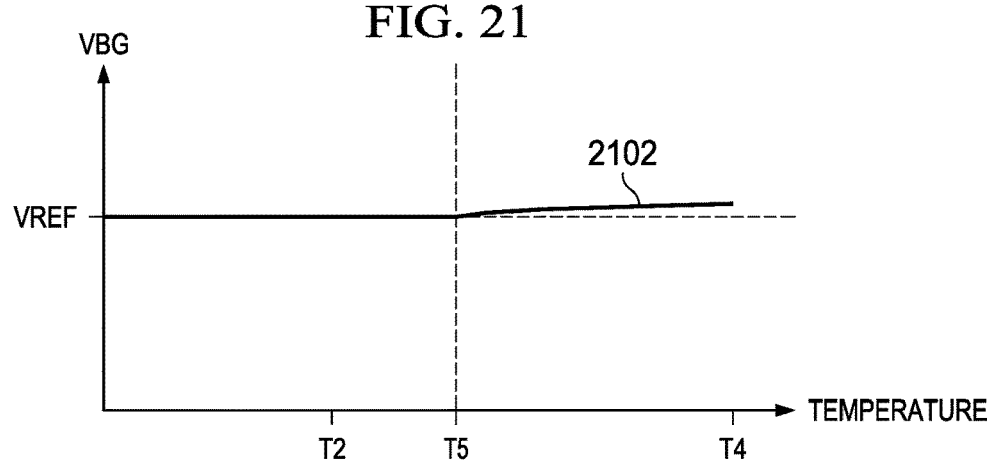

PIECEWISE COMPENSATION METHOD FOR ULTRA-LOW TEMPERATURE DRIFT

BACKGROUND

Bandgap reference circuits are used to provide a reference voltage in a variety of system applications, such as analog to digital converters (ADCs or A/Ds), digital to analog converters (DACs or D/As), etc. For many such applications, low temperature drift is desired to provide a reference voltage signal that does not vary with changing temperature. The output voltage VBG of a bandgap reference circuit varies as a function of temperature, including first order and higher order effects. First and second order trimming for curvature correction and two-temperature trim does not achieve high precision performance. Higher order temperature drift effects in the presence of manufacturing process variations and mismatch between circuit components inhibit further temperature drift reduction, particularly at extreme ends of a temperature range of interest.

SUMMARY

In accordance with one aspect of the disclosure, an electronic device includes a bandgap reference circuit having an output terminal, and a bias input, as well as a piecewise compensation circuit having an output coupled to the bias input, and an input. The electronic device also includes a piecewise compensation current generator having an output coupled to the input of the piecewise compensation circuit, and a knee point temperature adjustment circuit coupled to the output of the piecewise compensation current generator.

In one example, the electronic device of claim 1, wherein the knee point temperature adjustment circuit includes a DAC having an output coupled to the output of the piecewise compensation current generator. In one implementation, the DAC is a current DAC configured to provide an analog piecewise compensation current signal to the output of the piecewise compensation current generator. In one example, the current DAC is configured to provide the analog piecewise compensation current signal with a knee point temperature set according to a multi-bit knee point temperature code at an input of the current DAC. In one example, the piecewise compensation circuit includes first and second trim DACs, where the first trim DAC has an output to provide an analog piecewise linear compensation current signal to the output of the piecewise compensation circuit based on the analog piecewise compensation current signal. The second trim DAC has an output to provide an analog piecewise nonlinear compensation current signal to the output of the piecewise compensation circuit based on the analog piecewise compensation current signal.

In one example, the piecewise compensation circuit includes a first trim DAC having an output to provide an analog piecewise linear compensation current signal to the output of the piecewise compensation circuit based on the analog piecewise compensation current signal. The piecewise compensation circuit in one example includes a second trim DAC having an output to provide an analog piecewise nonlinear compensation current signal to the output of the piecewise compensation circuit based on the analog piecewise compensation current signal.

In one example, the DAC of the knee point temperature adjustment circuit includes first and second circuit branches. The first circuit branch in one example has a first transistor and a first resistor coupled in series with one another between a supply node and a bias node, where the first transistor has a control terminal coupled to a first voltage signal. The second circuit branch has a second transistor and a second resistor coupled in series with one another between the supply node and the bias node, where the second transistor has a control terminal coupled to a second voltage signal. The first voltage signal is one of proportional to absolute temperature (PTAT) and complementary to absolute temperature (CTAT), and the second voltage signal is the other one of PTAT and CTAT. In one implementation, the DAC of the knee point temperature adjustment circuit includes an output transistor coupled between the output of the piecewise compensation current generator and one of the first and second circuit branches.

In another aspect, an electronic device includes a bandgap reference circuit having a bias input, and a bandgap output terminal that provides an output voltage signal. A piecewise compensation circuit has an output that provides a piecewise compensation signal to the bias input of the bandgap reference circuit. A piecewise compensation current generator has an output that provides a piecewise compensation current signal to the input of the piecewise compensation circuit, and a knee point temperature adjustment circuit sets a knee point temperature of the piecewise compensation current signal.

Another aspect provides a system that includes an electronic circuit having a reference voltage input, and a voltage reference. The voltage reference includes a bandgap reference circuit having an output terminal coupled to the reference voltage input of the electronic circuit, and a bias input, a piecewise compensation circuit having an output coupled to the bias input, and an input, and a piecewise compensation current generator having an output coupled to the input of the piecewise compensation circuit, and a knee point temperature adjustment circuit coupled to the output of the piecewise compensation current generator. In one example, the knee point temperature adjustment circuit includes a digital to analog converter (DAC) having an output coupled to the output of the piecewise compensation current generator.

BRIEF DESCRIPTION OF THE DRAWINGS

FIG. 13 is a signal diagram of uncompensated bandgap reference circuit output voltages for multiple reference generator circuits as a function of temperature.

FIG. 14 is a signal diagram of first and second order corrected bandgap reference output voltage as a function of temperature with a temperature drift.

FIG. 15 is a signal diagram of piecewise linear and nonlinear compensated bandgap reference output voltage for multiple reference generator circuits as a function of temperature with the temperature drift bend point different than the fixed piecewise compensation knee.

FIG. 19 is a signal diagram of a piecewise linear compensated bandgap reference circuit output voltage as a function temperature with an adjusted temperature drift bend point.

FIG. 20 is a signal diagram of a bandgap reference output voltage piecewise nonlinear compensation current as a function of temperature with a piecewise compensation knee at a temperature adjusted to the temperature drift bend point of FIG. 19.

FIG. 21 is a signal diagram of piecewise linear and nonlinear compensated bandgap reference output voltage as a function of temperature with the piecewise compensation knee of FIG. 20 at a temperature adjusted to the temperature drift bend point of FIG. 19.

DETAILED DESCRIPTION

Figure 1:
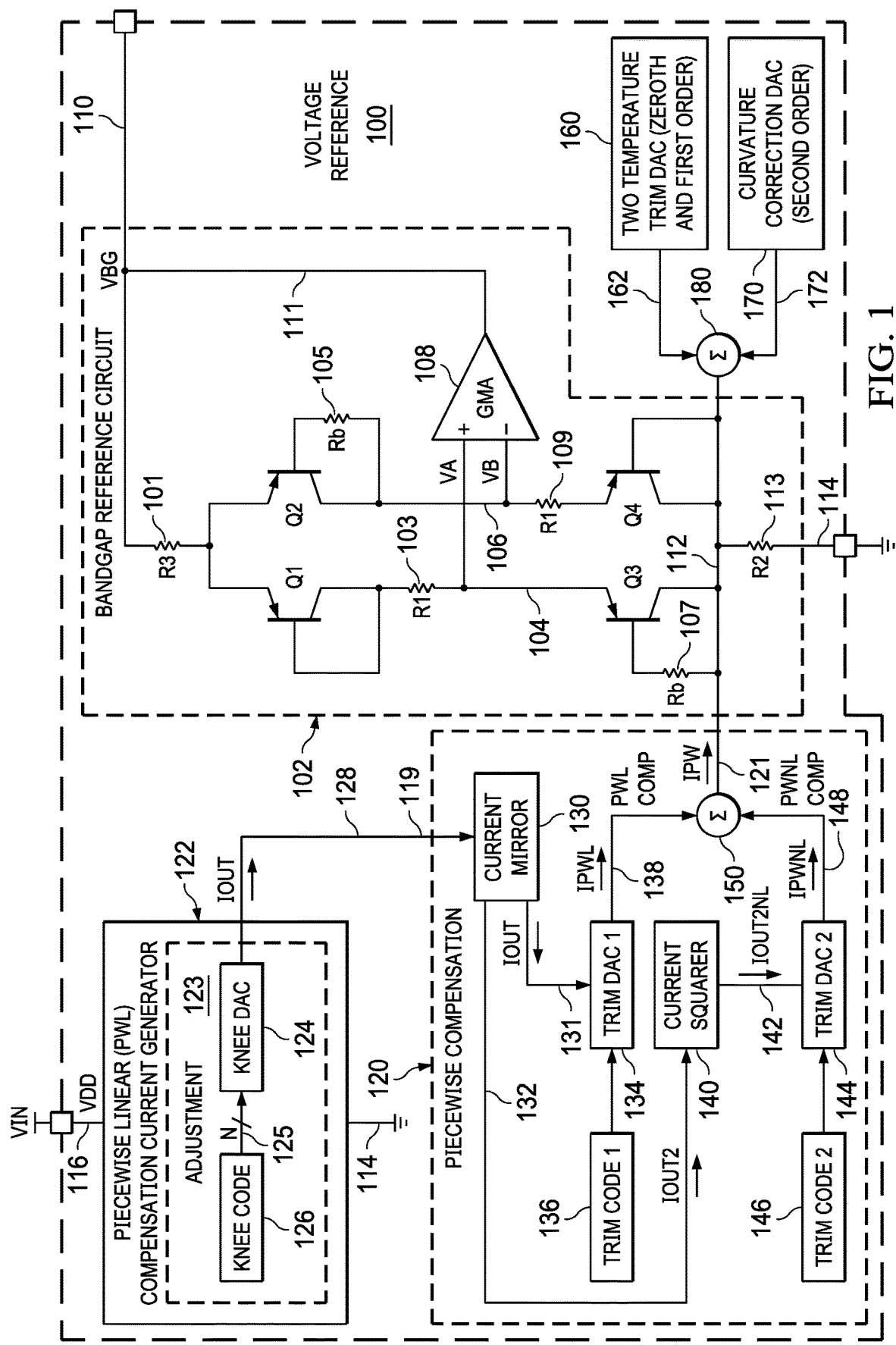
FIG. 1 is a schematic diagram of a voltage reference electronic device having a piecewise correction current generator circuit with a knee adjustment trim circuit.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a voltage reference electronic device 100, such as an integrated circuit or other packaged electronic device. The electronic device 100 includes a bandgap reference circuit 102 with a first internal node 104 with a first voltage VA in a first circuit branch, as well as a second internal node 106 with a second voltage VB in a second circuit branch. The example bandgap reference circuit 102 also includes a transconductance amplifier (GMA) 108, which includes an inverting (e.g., "−") input coupled to the first internal node 106 and a non-inverting (e.g., "+") input coupled to the second internal node 104. The voltage reference electronic device 100 also has an output terminal 110 coupled to an output terminal 111 of the transconductance amplifier 108. In operation when the circuit is powered, the output terminal 110 provides an output voltage signal VBG (e.g., a bandgap reference voltage signal).

A resistor 101 with a resistance R3 is coupled between the output terminal 110 and a matched pair of pnp bipolar transistors Q1 and Q2. Q1 is diode connected, with an emitter coupled to the resistor R3, and a base and collector coupled through a resistor 103 with a resistance R1 to the first internal node 104. The emitter of Q2 is coupled to the resistor 101, and a bias resistor 105 with resistance Rb is coupled between the base and collector of Q2. The collector of Q2 is coupled to the second internal node 106. A resistor 109 with a resistance R1 is coupled between the second internal node 106 and another diode-connected pnp bipolar transistor Q4. A pnp bipolar transistor Q3 has an emitter coupled to the first internal node 104, a base coupled through another bias resistor 107 with a resistance Rb to the collector of Q3.

The bandgap reference circuit 102 has a bias input 112 coupled to the collectors of Q3 and Q4. A bias resistor 113 with a resistance R2 is coupled between the bias input 112 and a reference node 114 (e.g., bandgap circuit ground reference). The current through the bias resistor 113 from the first and second circuit branches of the bandgap reference circuit 102 and any additional bias current(s) applied to the bias input 112 (e.g., sourced and/or sinked) set the voltage across the resistor 113 and hence the voltage of the bias input 112 relative to the voltage of the reference node 114. The bandgap reference circuit 102 can be of any suitable topology having an output terminal 110 that provides an output voltage signal, and a bias input 112 that sources and/or sinks bias current. Different circuit implementations are possible in other implementations. The electronic device 100 includes a power supply input or supply node 116 that receives an input voltage signal VIN and provides an internal supply voltage signal VDD.

The electronic device 100 also includes a piecewise compensation circuit 120 having an output 121 coupled to the bias input 112, and an input 119. In one example, the piecewise compensation circuit 120 is integrated with the bandgap reference circuit 102 and the further circuitry of FIG. 1 in a single chip, with interconnections therebetween made through direct silicon connections and/or metallization layer routings (not shown). The output terminal 121 is coupled to the bias input 112 of the bandgap reference circuit 102. The output 121 of the piecewise compensation circuit 120 is configured to provide a piecewise compensation signal, in one example, a current signal labeled IPW in FIG. 1, to the bias input 112 of the bandgap reference circuit 102.

In one example, the piecewise compensation signal IPW compensates for temperature effects on the output voltage signal VBG to control the amplitude of the voltage with respect to temperature in a non-zero range from a first temperature T1 to a second temperature T2 as illustrated and described in greater detail below with respect to FIGS. 7-21 below. In one example, the piecewise compensation operates for compensating three temperature ranges, including a first range from a temperature T1 to T2, for example, that represents a desired thermal operating range for the electronic device in a host circuit or system. A second range extends below the first temperature T1 to a third temperature T3 (e.g., T3<T1), and a third range extends above the second temperature T2 to a fourth temperature T4 (e.g., T4>T2). The boundaries between these ranges or pieces of the piecewise compensation temperature domain are referred to as knees or bend points, although these need not exhibit an actual inflection or bend of a performance parameter (e.g., voltage, current, etc.) with respect to temperature.

Although illustrated and described in the context of an example implementation involving three temperature ranges or pieces, and two bend points or knee temperatures, other implementations are possible that provide piecewise compensation for any integer number k temperature ranges or pieces, having k−1 associated bend points or knee temperatures, where k is greater than 1. The illustrated example, moreover, provides both piecewise linear and piecewise nonlinear compensation. In other examples, individual pieces or temperature ranges can be compensated linearly and/or non-linearly or combinations thereof.

The electronic device 100 includes a piecewise compensation current generator 122 having a knee point temperature adjustment circuit 123 with a knee adjustment DAC (e.g., knee DAC) 124. The knee DAC 124 has an input 125 that receives a knee point temperature code 126. The piecewise compensation current generator 122 has an output 128 coupled to the input 119 of the piecewise compensation circuit 120. In one example, the piecewise compensation current generator 122 and the piecewise compensation circuit 120 are integrated in a single chip, and the output 128 is coupled to the input 119 through a direct silicon connection and/or metallization layer routings (not shown). The piecewise compensation current generator output 128 provides a piecewise compensation current signal IOUT to the input of the piecewise compensation circuit 120 to set a knee point temperature (e.g., T1, T2 in FIGS. 7-21 below) of the piecewise compensation current signal IOUT. In one example, the knee DAC input 125 is coupled to a memory register to receive a programmable or adjustable knee code 126. In another example, the knee DAC input 125 is coupled to a one-time programmable (OTP) circuit (e.g., fuses, etc.) that is programmed with the knee point temperature code 126 during manufacturing of the electronic device 100.

In one example, the knee DAC 124 is a current DAC that provides an analog piecewise compensation current signal IOUT to the output 128 of the piecewise compensation current generator 122. Moreover, the knee DAC 124 in one example provides the analog piecewise compensation current signal IOUT with a knee point temperature T1, T2. A multi-bit knee point temperature code 126 at an input 125 of the knee DAC 124 sets the knee point temperature T1, T2 of the analog piecewise compensation current signal IOUT. In one example, a separately controlled piecewise compensation circuit 120 and associated piecewise compensation current generator circuit 122 is provided for each of the two temperature knees for separately setting the associated knee temperature, only one of which is illustrated in FIG. 1 for sake of clarity.

In the example of FIG. 1, the piecewise compensation circuit 120 includes separate components for implementing respective linear and nonlinear compensation. In this example, a current mirror circuit 130 receives the analog piecewise compensation current signal IOUT from the output 128 of the piecewise compensation current generator 122. The analog piecewise compensation current signal IOUT in one example is piecewise linear. The current mirror circuit 130 includes a first output 131. The first output 131 provides a first mirrored current signal, labeled IOUT1 in FIG. 1. The current mirror circuit 130 includes a second output 132. The second output 132 provides a second mirrored current signal, labeled IOUT2 in FIG. 1. In one example, the first mirrored current signal IOUT1 and the second mirrored current signal IOUT2 are piecewise linear as a function of temperature. In one example, the current mirror circuit 130 has a 1:1 ratio and the first and second mirrored current signals IOUT1 and IOUT2 are of approximately equal amplitude.

The piecewise compensation circuit 120 includes a first trim DAC 134 having an output 138 that provides an analog piecewise linear compensation current signal IPWL directly or indirectly to the output 121 of the piecewise compensation circuit 120 based on the analog piecewise compensation current signal IOUT and a first trim code 136 (e.g., labeled TRIM CODE 1 in FIG. 1). In one example, the first trim DAC 134 is coupled to a memory register to receive a programmable or adjustable first trim code 136. In another example, the first trim DAC 134 is coupled to a one-time programmable (OTP) circuit (e.g., fuses, etc.) that is programmed with the first trim code 136 during manufacturing of the electronic device 100. The analog piecewise linear compensation current signal IPWL provides piecewise linear compensation to the bias input 112 of the bandgap reference circuit 102 (e.g., labeled "PWL COMP" in FIG. 1) via the output 121 of the piecewise compensation circuit 120.

The piecewise compensation circuit 120 also includes components for piecewise nonlinear compensation. A current squarer circuit 140 has an input coupled to the second output 132 of the current mirror circuit 130 to receive the second mirrored current signal IOUT2. The current squarer circuit 140 also has an output 142 that provides a nonlinear current signal IOUT2NL based on the second mirrored current signal IOUT2. The output 142 of the current squarer circuit 140 is coupled to a second trim DAC 144 (e.g., labeled "TRIM DAC 2"). The second trim DAC 144 has an output 148 that provides an analog piecewise nonlinear compensation current signal IPWNL to the output 121 of the piecewise compensation circuit 120 based indirectly on the analog piecewise compensation current signal IOUT and a second trim code 146 (e.g., labeled TRIM CODE 2 in FIG. 1). In one example, the second trim DAC 144 is coupled to a memory register to receive a programmable or adjustable second trim code 146. In another example, the second trim DAC 144 is coupled to a one-time programmable (OTP) circuit (e.g., fuses, etc.) that is programmed with the second trim code 146 during manufacturing of the electronic device 100.

The analog piecewise nonlinear compensation current signal IPWNL provides piecewise nonlinear compensation to the bias input 112 of the bandgap reference circuit 102 (e.g., labeled "PWNL COMP" in FIG. 1) via the output 121 of the piecewise compensation circuit 120. FIG. 1 also shows a summer 150 that sums the respective analog piecewise linear and nonlinear compensation current signals IPWL and IPWNL to provide a piecewise compensation current signal IPW at the output 121 of the piecewise compensation circuit 120. In one example, the summer 150 is a summing junction or node coupled to the outputs of the respective first and second trim DACs 134 and 144.

The example electronic device 100 includes lower order temperature compensation components, including a two temperature trim DAC 160 with an output 162, and a curvature correction DAC 170 with an output 172. The outputs 162 and 172 are coupled to a summer 180 (e.g., a summing junction or node) coupled to provide the respective analog bias currents to the bias input 112 of the bandgap reference circuit 102. In this example, the bias input 112 facilitates temperature compensation for $0^{th}$, $1^{st}$, $2^{nd}$ and higher order thermal effects in the electronic device 100 to mitigate temperature drift of the output voltage signal VBG and provide a high precision voltage reference with ultra-low temperature drift. In particular, the two temperature trim DAC 160 compensates for $0^{th}$ and $1^{st}$ order thermal effects, the curvature correction DAC 170 compensates for $2^{nd}$ order effects, and the piecewise compensation circuit 120 compensates for higher order thermal effects on the output voltage signal VBG. The bandgap output voltage signal VBG can be represented as:

$$VBG = V_{REF} + V_0 + V_1(T-T_0) + V_2(T-T_0)^2 + V_3(T-T_0)^3 + \ldots$$

The electronic device 100 mitigates output voltage temperature drift with compensation circuitry that senses the temperature and adds a corrective signal or signals to the bias input 112 to regulate the output voltage signal VBG at the output terminal 110. In this manner, the compensation operates to reduce V1, V2 and V3 in the above expression. In one example, the voltage at a first temperature T1 (e.g., 25 degrees C.) and slopes (e.g., V0 and V1) are corrected by the two temperature trim DAC 160. In this example, the $2^{nd}$ order effects are compensated by the curvature correction DAC 170, but the curvature correction only compensates temperature drift in a limited temperature range. Process variations and/or component value mismatch issues can increase the temperature drift (e.g., above about 5-10 ppm/C) absent further compensation.

The piecewise compensation circuit 120 facilitates further temperature drift reduction, for example, to achieve temperature drift of less than 0.5-1.0 ppm/C, by compensating higher order thermal effects. For example, bandgap curvature, high temperature device leakage errors and beta lowering at low temperatures can be compensated by correction of $3^{RD}$ or higher order effects in combination with piecewise correction. In particular, process variations/mismatch cause higher order terms to be non-zero following curvature correction compensation by the curvature correction DAC 170, and $2^{ND}$ and higher order components at extreme temperature can inhibit the ability to achieve ultra-low temperature drift.

Figure 2:
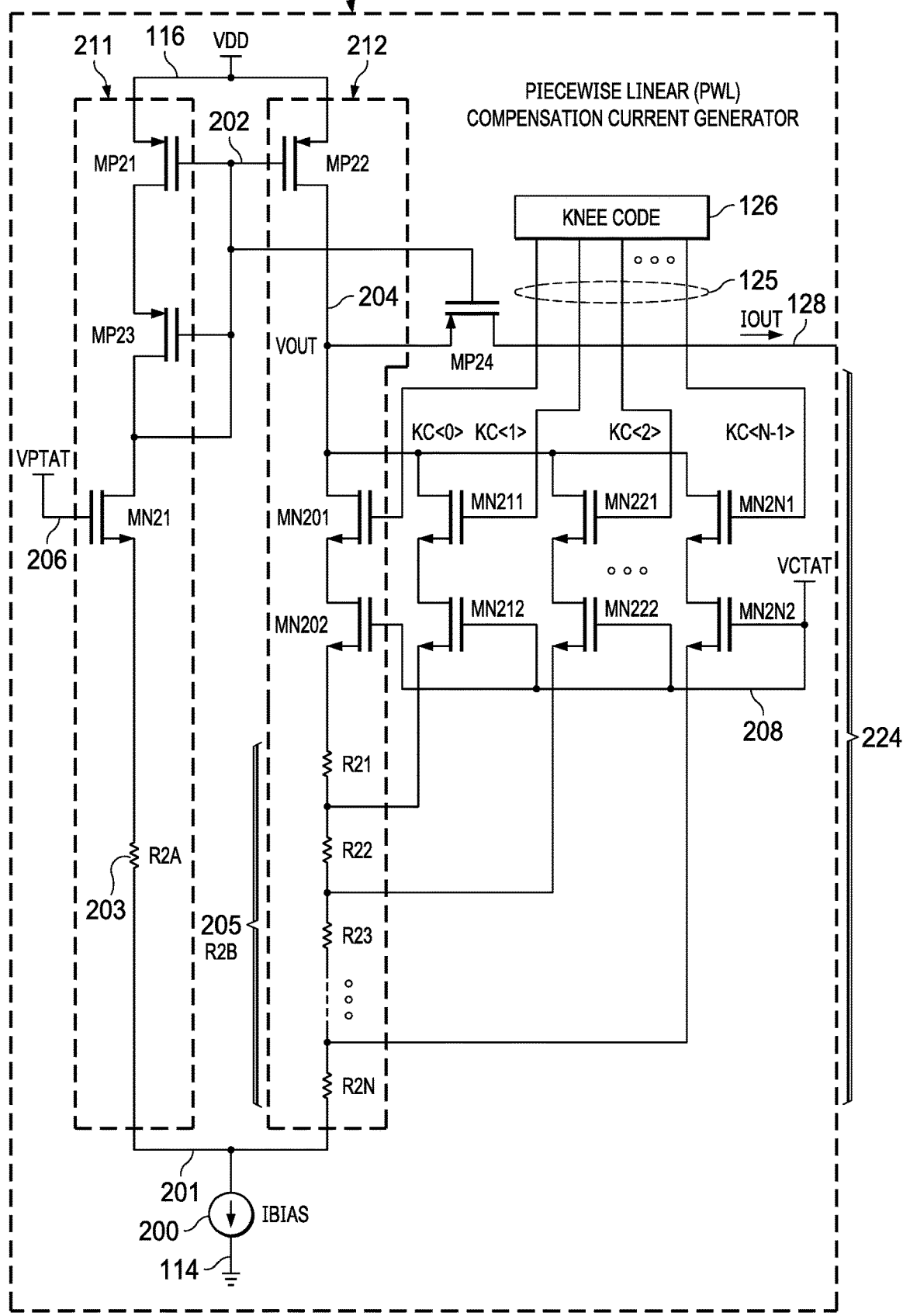
FIG. 2 is a schematic diagram of an example knee adjustment current digital to analog converter (DAC) in the piecewise correction current generator circuit of FIG. 1.
Figure 3:
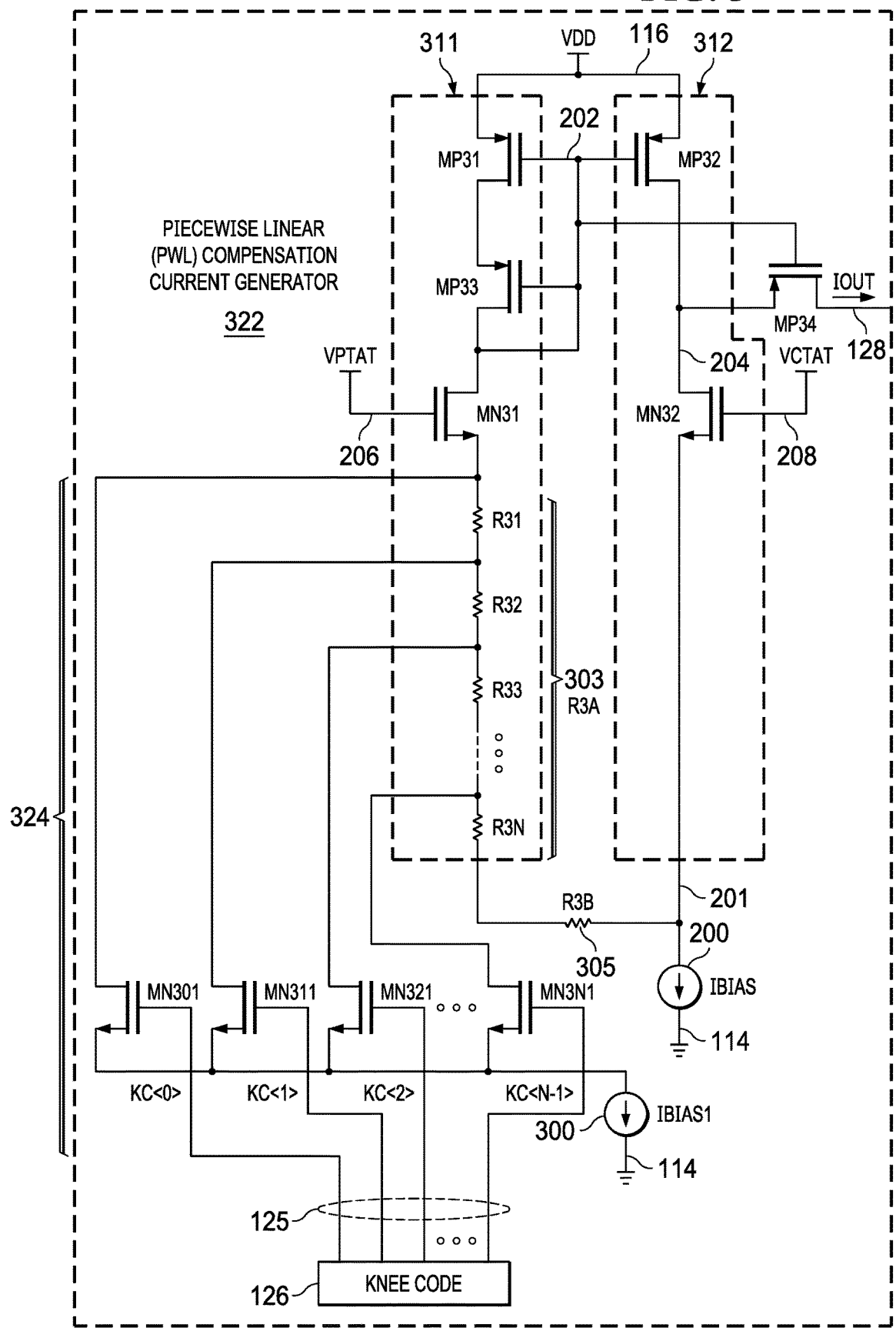
FIG. 3 is a schematic diagram of another example knee adjustment current DAC in the piecewise correction current generator circuit of FIG. 1.
Figure 4:
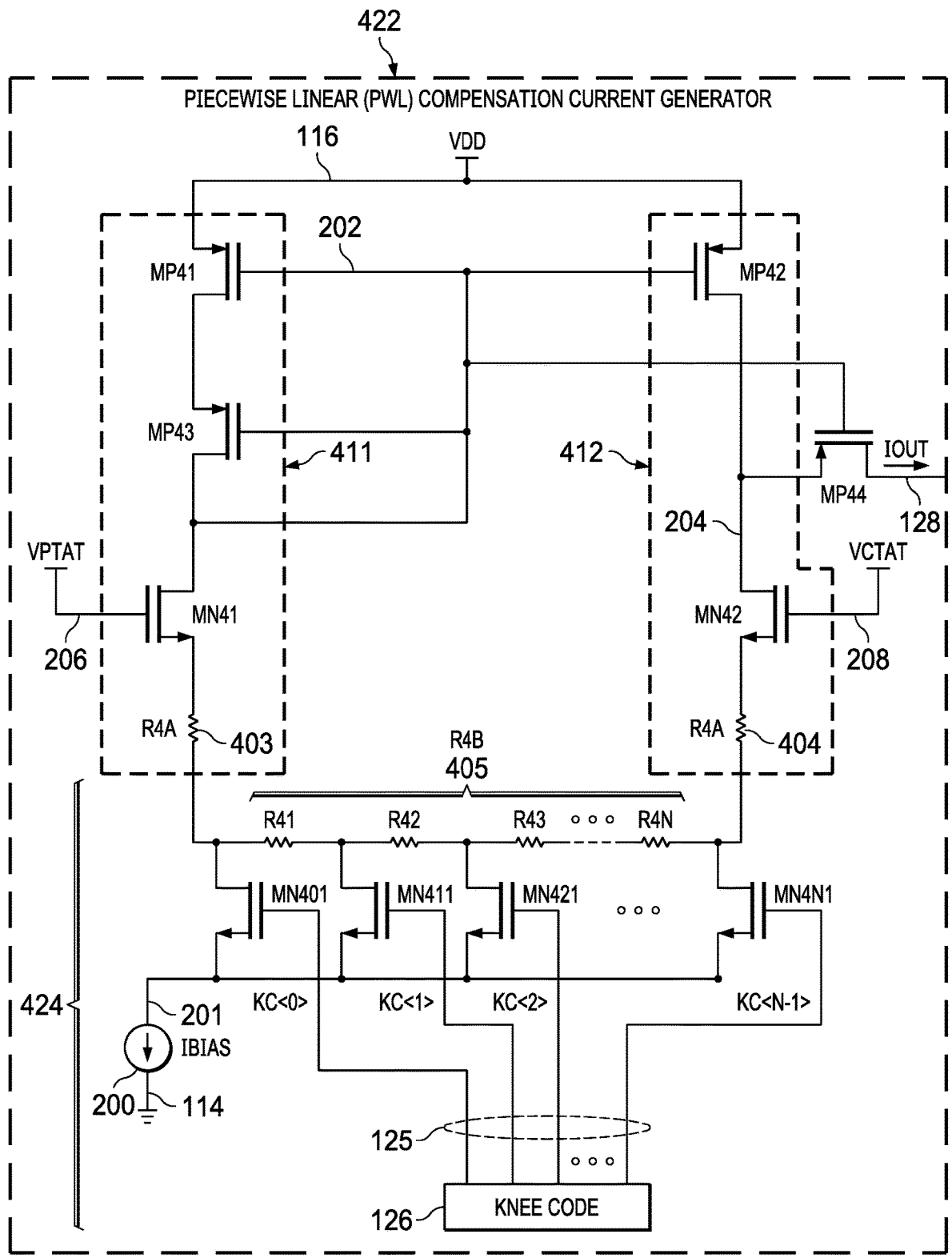
FIG. 4 is a schematic diagram of another example knee adjustment current DAC in the piecewise correction current generator circuit of FIG. 1.

FIGS. 2-4 show several non-limiting examples of knee DACs and piecewise correction current generator circuitry that can be used as the knee DAC 124 in the piecewise correction current generator circuit 122 of FIG. 1. FIG. 2 shows a piecewise correction current generator circuit 222 with a knee current DAC 224. The example in FIG. 2 includes first and second circuit branches 211 and 212, respectively. The circuit branches include series connected transistors and resistors coupled between the supply node 116 and a bias current source 200 (IBIAS) at a bias node 201. The circuit is biased by respective proportional to absolute temperature (PTAT) and complementary to absolute temperature (CTAT) voltage signals VPTAT and VCTAT, and an output transistor coupled between the output 128 and one of the first and second circuit branches to ensure that the analog piecewise compensation current signal IOUT and a first trim code 136 only flows in one direction to the output 128.

The example knee DAC 224 of the compensation current generator 222 in FIG. 2 includes p-channel field effect transistors (e.g., PFETs or PMOS transistors) MP21, MP22, MP23 and MP24, n-channel FETs (e.g., NFETs or NMOS transistors) including a first transistor MN21 coupled in series with MP21 and MP23, an integer number N selection transistors MN201, MN211, MN221, MN2N1 and N bias transistors MN202, MN212, MN222, and MN2N2. The first circuit branch 211 in this example includes a first transistor MN21 with a gate control terminal 206 coupled to the PTAT voltage signal VPTAT (e.g., a voltage signal that varies proportionally to absolute temperature, having a positive temperature coefficient). A first resistor 203 with a resistance R2A is coupled in series with the first transistor MN1 between the supply node 116 and the bias node 201. The transistor MP23 is diode-connected and the transistors MP21 and MP22 have their gates coupled together at a control node 202 which controls the gate voltage of the output transistor MP24. The p-channel output transistor MP24 selectively controls the output current IOUT flow from a node 204 (the drain of MP22) to the output 128 for piecewise compensation of the bandgap reference circuit bias input 112 in FIG. 1, while preventing current from flowing from the output 128 to the node 204.

The second circuit branch 212 in this example includes a second transistor MP22, a selected one or more of the bias transistors MN202, MN212, MN222, . . . , MN2N2, and a second resistor 205 with a resistance R2B coupled in series between the supply node 116 and the bias node 201. The resistance R2B is a selected series combination of the resistance of one or more of N resistors R21, R22, R23, . . . , R2N, where N is greater than 1. The knee code 126 includes N bits KC<0> to control MN01, KC<1> to control MN211, KC<2> to control MN221, . . . , KC<N−1> to control MN2N1. In one example, the knee code 126 includes only a single asserted bit to turn on only one of the N selection transistors MN201, MN211, MN221 or MN2N1. In another example, the knee code 126 includes one or more asserted bits to turn on one or more respective ones of the N selection transistors MN201, MN211, MN221 and/or MN2N1. In one example, the individual resistors R21, R22, R23, . . . , R2N are of approximately equal resistance values. In another example, two or more of the resistors R21, R22, R23, . . . , R2N have different resistance values from one another. The drains of the selection transistors MN201, MN211, MN221, . . . , MN2N1 are coupled together at the node 204, and the respective sources are coupled to a respective one of the bias transistors MN202, MN212, MN222, . . . , MN2N2. The bias transistors MN202, MN212, MN222, . . . , MN2N2 each have a gate control terminal 208 coupled to the CTAT second voltage signal VCTAT (e.g., a voltage signal that varies in complementary fashion with respect to absolute temperature, having a negative temperature coefficient).

The knee code 126 sets a balance point temperature at which the knee DAC circuit 224 begins to deliver positive current IOUT through the output transistor MP24 to the output 128 according to the counteracting influences of the first and second circuit branches and the respective PTAT and CTAT bias voltage connections. In one example, a separately controlled piecewise compensation circuit 120 and associated piecewise compensation current generator circuit 122 is provided for each of two temperature knees (e.g., at T1 and T2 in FIGS. 7-21 below) for separately setting the associated knee temperature. In one implementation, the knee DAC circuit 224 of FIG. 2 is used to set the knee temperature for a first piecewise compensation current signal IOUT and a respective piecewise compensation circuit (e.g., 120 in FIG. 1) provides a first piecewise compensation current IPW to the bias input 112 of the bandgap reference circuit 102. In this example, a second knee DAC circuit and respective second piecewise compensation circuit provide a second piecewise compensation current (e.g., similar to IPW with a different polarity) to selectively source or sink bias current to or from the bias input 112 of the bandgap reference circuit 102 in FIG. 1 for temperatures T1 or lower, where the second knee DAC circuit is similar to the circuit 224 of FIG. 2 with the VPTAT and VCTAT inputs interchanged, and with an n-channel output transistor (not shown) to selectively allow sink current to flow from the bias input 112 of FIG. 1 into the second knee DAC circuit at or below the knee temperature (e.g., T1) while preventing current flow from the second knee DAC circuit to the bias input 112 of the bandgap reference circuit 102 of FIG. 1.

The electronic device 100 of FIGS. 1 and 2 provides variable knee piecewise linear and nonlinear compensation solution to facilitate low thermal drift in the bandgap output voltage VBG. Unlike piecewise compensation using fixed inflection or knee point temperatures, the disclosed example provides a circuit topology that renders the piecewise compensation signal IPW to provide variable inflection or knee temperature which is independent of process and can be set during electronic device manufacturing. The higher order piecewise compensation signal or signals is or are set by a resistor ratio that can yield near zero variation, for example, if implemented with thin film resistors (TFR). The example of FIG. 2 provides an adjustable or factory trimmable tapping point for changes in the resistance R2B across a trim code range (e.g., an 8-bit trim code TRIM[7:0]). In one example, the knee point temperature $T_{Knee}$ for the piecewise compensation is proportional to (R2A-R2B). For TRIM[0] $T_{Knee}=T_{cross}$ (the crossing point of the input signals VPTAT and VCTAT shown in FIG. 2), and the magnitude scales across TRIMCODE1 of 136 in FIG. 1. In operation, the knee point temperature $T_{Knee}$ is given as:

$$T_{Knee} = T_{cross} + \frac{(V_T)_{T=Tcross} * IN(N)_* \left(\frac{R2A - R2B}{R1}\right)}{m_1 + m_2}$$

If $(g_{m_1} R2A, g_{m_2} R2B) \gg 1$, where $T_{Knee}$ is the knee point temperature, N is the number of bits of the trim code, m1 and m2 are the slopes of tap points VPTAT and VCTAT respectively, and gm1 and gm2 are the transconductances of transistors connected to VPTAT and VCTAT, respectively. As the trim code increases, R2B decreases and the knee point temperature $T_{Knee}$ increases. A piecewise linear compensation output voltage $V_{OUT}$ at the node 204 is given as:

$$V_{OUT} = IOUT * R2 = \frac{2R2}{R2B} \frac{(m_1 + m_2)}{\frac{R2A}{R2B} + 1} + \frac{R2}{R1} \frac{R2(V_T)_{T=Tcross} * IN(N) * (R2B - R2A)}{(R2A + R2B)}$$

where R2A and R2B are degeneration resistances of the respective resistors 203 and 205 of the piecewise compensation current generator circuit 222 in FIG. 2, the resistances of the respective bandgap resistors are R1 (resistors 103 and 109 in FIG. 1) and R2 (resistor 113 in FIG. 1), $V_T$ is the threshold voltage of the output transistor MP24, and N is the ratio of the bipolar junction transistor (BJT) size in the bandgap reference circuit 102, where process variation depends only on the resistor ratio. The adjustment circuit 123 in FIG. 1 provides an adjustable temperature knee mechanism that can be digitally controlled by the knee code 126. The knee point of temperature and piecewise correction voltage is dependent only on the resistor ratio, and thus both the knee point of temperature and the piecewise correction voltage are independent of process variations. TFR resistors help achieve excellent matching, and the achievable temperature drift is independent of the temperature point of inflection or "bend" in the bandgap output for a given manufactured device 100. In certain examples, temperature drift (u+6σ) of less than 1 ppm/C is possible.

FIGS. 3 and 4 show alternate piecewise linear compensation circuit examples that can be used as the knee DAC 124 in the piecewise correction current generator circuit 122 of FIG. 1. FIG. 3 shows a piecewise correction current generator circuit 322 with a knee current DAC 324. The example in FIG. 3 includes respective first and second resistors 303 and 305, as well as respective first and second circuit branches 311 and 312. The first circuit branch 311 includes series connected p-channel transistors MP31 and MP33, with MP31 coupled between the supply node 116 and MP33. MP33 is diode connected between MP31 and a drain of an n-channel first transistor MN31. The gate control terminal 206 of MN31 is coupled to the VPTAT voltage signal, and the source of MN31 is coupled through a first resistor 303 with a resistance R3A formed by series connected resistors R31, R32, R33, . . . , R3N to a second resistor 305 with a resistance R3B. The second circuit branch 312 includes a p-channel transistor MP32 coupled between the supply node 116 and the node 204. The second circuit branch 312 also includes an n-channel second transistor MN32 with a drain coupled to the node 204, a control terminal 208 coupled to the VCTAT voltage signal, and a source coupled to the bias node 201, with the second resistor 305 coupled between the bias node 201 and the first resistor 303. A p-channel output transistor MP34 is coupled between the node 204 and the output 128, with a gate control terminal coupled to the gates of MP31, MP32 and MP33 at the node 202. The knee DAC 324 includes n-channel select transistors MN301, MN311, MN321, . . . , MN3N1 coupled to the knee DAC input 125 to receive the N bits KC<0>, KC<1>, KC<2>, . . . , KC<N-1> of the knee code 126. A variety of different current or voltage DAC circuit configurations can be used to provide a bias signal for piecewise compensation (e.g., the piecewise compensation current IPW, or a compensation voltage, etc.) to tradeoff various design parameters such as knee temperature resolution, range and circuit area. For a given design and/or process, a raw bandgap output voltage curvature profile can be determined for a range of temperatures, for example, in a test chip, and the DAC can be designed to provide an appropriate knee temperature adjustment range and resolution, within any circuit area restrictions, to provide adjustability during manufacturing to accommodate a large range sufficient enough to cover a predicted range of operation (e.g., T1=25 degrees C., T2=90 degrees C., T3=−20 degrees C., and T4=115 degrees C. In one example, the circuit configuration of FIG. 3 employs adjustment of the resistor RA on the PTAT circuit branch, and uses the bias current source 200 (IBIAS) at the bias node 201, as well as another bias current source 300 (with a current signal labeled IBIAS1) that is coupled to the sources of the N select transistors MN301, MN311, MN321, ..., MN3N1. This design can be used in complementary fashion for two sets of knee DAC circuits 324 and respective piecewise compensation circuits 120 for knee temperature adjustment at two different knee points (e.g., T1 and T2 below) for piecewise compensation of higher order thermal effects, with lower headroom (LHR) requirements than the example of FIG. 2.

FIG. 4 shows another nonlimiting example piecewise correction current generator circuit 422 with a knee DAC 424 that can be used as the knee DAC 124 in the piecewise correction current generator circuit of FIG. 1. The example in FIG. 4 has a split first resistor 403, 404 with individual resistances R4A in respective first and second circuit branches 411 and 412, and an adjustable second resistor 405 with a resistance R4B. The knee DAC 424 in this example uses symmetric switching of a bias current connection tap point of the second resistor 405 between the first and second circuit branches 411 and 412 to adjust the relative effects of the PTAT and CTAT circuit branches. The first circuit branch 411 includes series connected p-channel transistors MP41 and MP43, with MP31 coupled between the supply node 116 and the source of MP43. The transistor MP43 is diode connected between MP41 and the drain of the first transistor MN41. The gate control terminal 206 of MN41 is coupled to the VPTAT voltage signal, and the source of MN41 is coupled to the first resistor 413. The second circuit branch 412 includes an n-channel second transistor MN42 with a drain coupled to the node 204, a control terminal 208 coupled to the VCTAT voltage signal, and a source coupled to the first resistor 404 with a resistance R4A. A p-channel output transistor MP34 is coupled between the node 204 and the output 128, with a gate control terminal coupled to the gates of MP41, MP42 and MP43 at the node 202. The second resistor 405 includes the series connection of N resistors R41, R42, R43, ..., R4N between the first resistors 403 and 404. N selection transistors MN401, MN411, MN421, ..., MN4N1 are coupled between the bias node 201 and the tap points of the second resistor 405 and selectively couple one of the tap points to the bias node 201 according to the knee DAC code 126 to set the knee temperature of the current signal IOUT. Some design considerations include using greater than unity transconductance for the amplifier 108 of the bandgap reference circuit 102 and increasing bias current levels and higher transconductance to provide enough voltage headroom for biasing current mirrors. In one implementation additional deep trench (DT) rings can be added, as with one DT ring the VBS of one transistor will change with trim code. In addition, mismatch between input transistors contributes to total knee temperature variation across process and mismatch. However, the use of adjustment DAC circuits using switched combinations of resistors provides protection against process variations that affect each resistor similarly.

Figure 5:
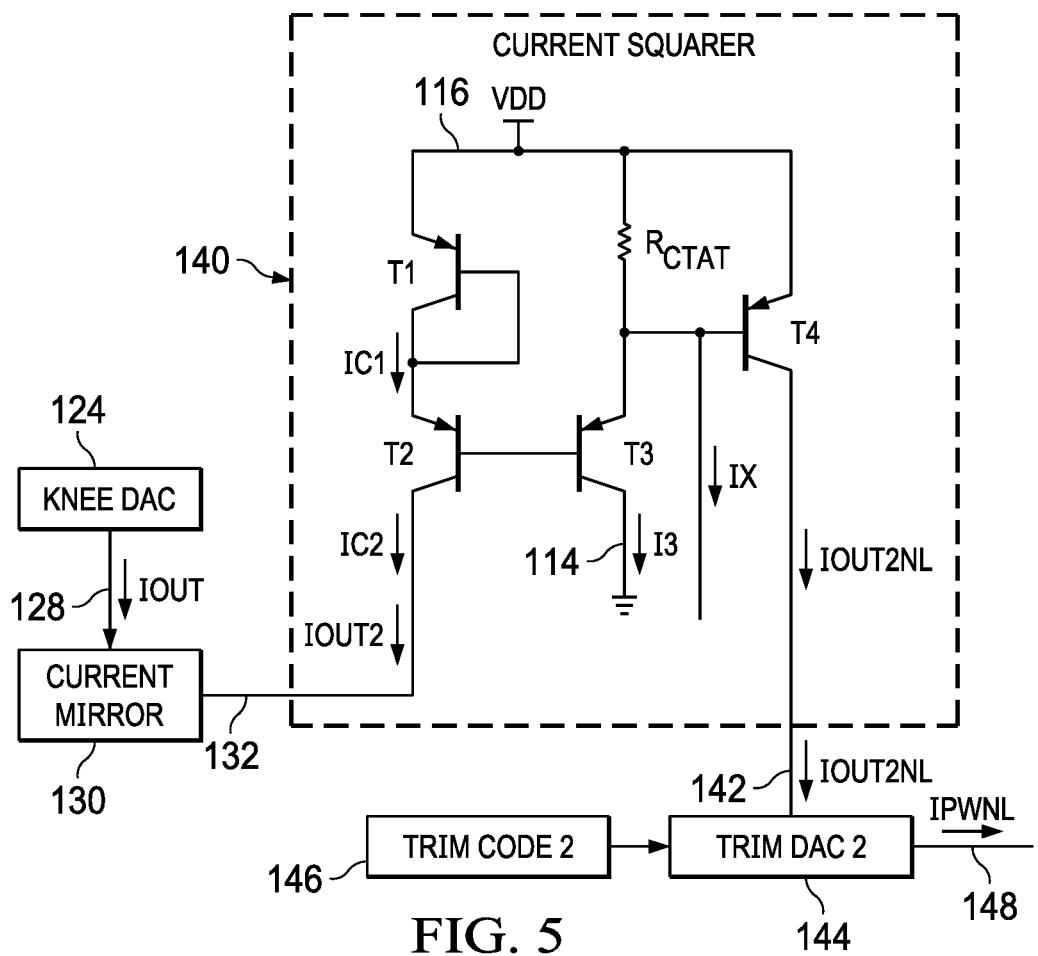
FIG. 5 is a schematic diagram of an example current squarer circuit in the piecewise correction current generator circuit of FIG. 1.

FIG. 5 shows an example current squarer circuit 140 in the piecewise compensation circuit 120 of FIG. 1. The circuit 140 includes a first diode connected pnp bipolar transistor T1 with a collector current IC1 coupled between the supply node 116 and a diode connected second pnp transistor T2 with a collector current IC2. The base of T2 is coupled to the base of a third pnp transistor T3 having a collector coupled to the reference node 114 with a collector current IC2. The transistor T3 has an emitter coupled to the supply node 116 through a resistor with a resistance $R_{CTAT}$ which will cause current through the emitter of the pnp transistor T3 to be CTAT. A fourth pnp transistor T4 has an emitter coupled to the supply node 116, with a collector current IOUT2NL. The transistor T4 has a base coupled to the emitter of T3, and a collector that provides the nonlinear output current IOUT2NL at the output 142 to the second trim DAC 144 as previously described. In this example, the nonlinear output current IOUT2NL is given as:

$$I_{OUT2NL} = \frac{IC1*IC2}{I_3} = \frac{IC1*IC2}{\left(\frac{V_{eb4}}{R_{CTAT}} - I_X\right)}$$

where, IC1=IC2=IOUT2, if $\beta_{1,2,3} \gg 1$ $$IPWNL = \frac{IPWL*IPWL}{\left(\frac{V_{be4}}{R_{CTAT}} - IX\right)};$$

In this example, Vbe4 is the base emitter voltage of T4. The output current IOUT2NL in this example increases with increase of $R_{CTAT}$. Nonlinearity of the output current IOUT2NL depends on value of 'k' (e.g., the amount of PTAT current (IX in FIG. 5) removed from base of T4).

Referring also to FIGS. 6-21, FIG. 6 shows a method 600 for knee adjustment of higher order piecewise correction in the piecewise correction current generator circuit 122 of FIG. 1, and FIGS. 7-21 show various signal diagrams and graphs illustrating the temperature effects and compensation techniques in some examples of the electronic device 100 during manufacturing. For a given temperature range (e.g., T1 to T2 in FIGS. 7-21), the temperature drift Temp.drift in ppm/C and the output voltage signal VBG can be respectively expressed as:

$$\text{Temp.drift} = \frac{(V_{BG,MAX} - V_{BG,MIN})}{V_{BG,nom} \times 10^6 \times (\text{temp range})} \text{ ppm/C., and}$$

$$V_{BG} = mVbe + X^*nVT^* \ln(N) \to V_{BG} =$$

$$V_{REF} + \frac{V_0 + V_1(T-T_0) + V_2(T-T_0)^2 + V_3(T-T_0)^3 + ...}{\text{Temp.drift}}$$

where m=2 for the example bandgap reference circuit 102 in FIG. 1, and X is of the form 1+R2/R1).

Figure 6:
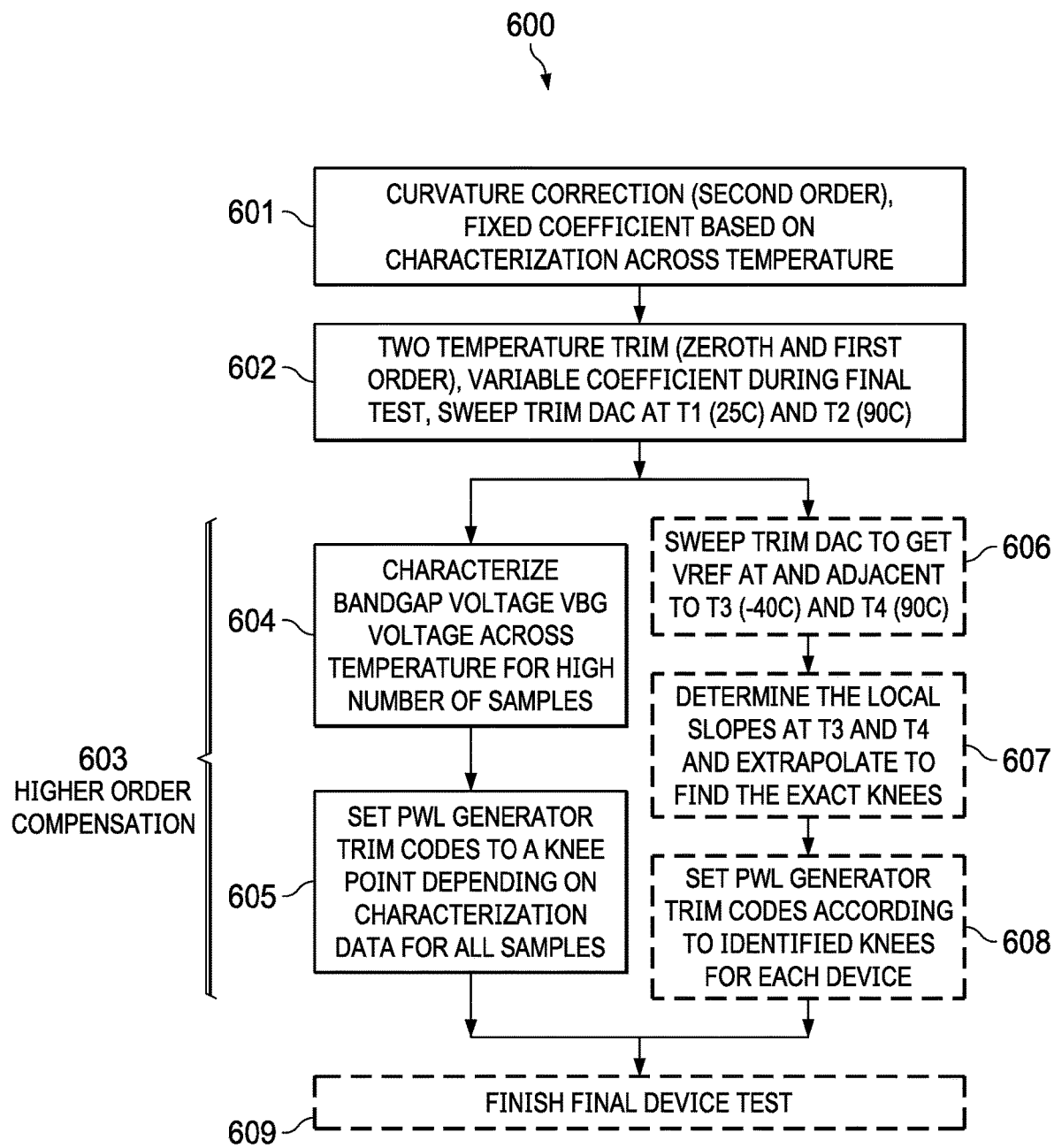
FIG. 6 is a flow diagram of a method for knee adjustment of higher order piecewise correction in the piecewise correction current generator circuit of FIG. 1.

The method 600 in FIG. 6 begins at 601 with curvature correction ($2^{ND}$ order), fixed coefficient based on a characterization across temperature. The acts or events of the method 600 in one example are performed based on user input or using programmed final test equipment and programming circuits to blow fuses or program memory registers to set trim and DAC codes in a fabricated integrated circuit product or processed wafer. The correction at 602 corrects the $2^{ND}$ order temperature effects, for example, using a fixed coefficient based on a characterization of a device 100 across temperature (or a number of devices of a processed wafer at wafer probe testing, or a number of devices 100 in a batch of processed wafers, etc.). The curvature correction in one example provides a DAC code for the curvature correction DAC 170 in FIG. 1. The method 600 continues at 602 in FIG. 6 with two temperature trim ($0^{th}$ and $1^{st}$ order), variable coefficient during final test, sweep trim DAC at T1 (25 C) and T2 (90 C). This provides two temperature trimming to set a DAC code for the two temperature trim DAC 160 in FIG. 1 to compensate for $0^{th}$ and 1st order thermal effects. One example uses a variable coefficient during final test and the trim DAC code for the two temperature trim DAC 160 in FIG. 1 is swept at T1 (e.g., 25 degrees C.) and T2 (e.g., 90 degrees C.).

Higher order compensation is performed at 603 in FIG. 6. One example characterizes bandgap voltage VBG voltage across temperature for a high number of samples at 604. One example includes characterizing the bandgap reference circuit output voltage VBG at 604 across a temperature range of interest (e.g., from T3 to T4 in the examples below, such as from −40 C to 125 degrees C.) for a high number of samples (e.g., a number of devices 100 of a processed wafer at wafer probe testing, or a number of devices 100 in a batch of processed wafers, etc.). At 605, the method 600 includes setting PWL generator trim codes to a knee point depending on characterization data for all samples. One example includes setting the knee code 126 at 605 to a temperature point depending on the characterization data obtained at 604 (e.g., a knee code for one or multiple piecewise linear compensation current generators of a given device 100, such as one for T1 and another for T2). At 609, the method includes finishing final device test. In one example, the determined DAC knee code(s) is or are programmed at 609, such as using fuses, a memory register, one-time programming, etc., and the final device test is finished. In another example, the method 600 includes sweep trim DAC to get VREF at and adjacent to T3 (−40 C) and T4 (125 C) at 606. In one example, the respective knee codes are swept at 606 to obtain or approximate the desired bandgap reference voltage output VREF at and adjacent to the end temperatures T3 (e.g., −40 degrees C.) and T4 (e.g., 125 degrees C.). The method at 607 includes determining the local slopes at T3 and T4 and extrapolating to find the example knees. The local slopes are determined in one example at 607 at the temperatures T3 and T4, and are extrapolated to determine or estimate the actual knee or bend temperature points. At 608, the method 600 includes setting PWL generator trim codes according to identified knees for each device. In one example, the DAC knee code(s) 126 are determined at 608 according to the identified or estimated knee point temperatures. The determined DAC knee code(s) in this example is or are programmed and the final device test is finished at 609. In one implementation, if the characterization at 604 shows a knee temperature that does not vary much device-to-device, the appropriate knee code(s) 126 can be determined and trim bits burned. One option is to have additional temperature insertions at temperatures adjacent to T3 and T4 (e.g., at or near −40 and 125 degrees C.) at 606 and thereby determine the local slope and hence extrapolate to find the exact knee. However additional temp insertions are test costly. As an alternative, the processed wafer can include an on-chip heater element to alter the temperature and thereby enable readings at multiple temperatures at the same insertion. This information can be extrapolated to find the knee point for the device and appropriate trim code(s) can be calculated and burned on a per-device basis.

Figure 7:
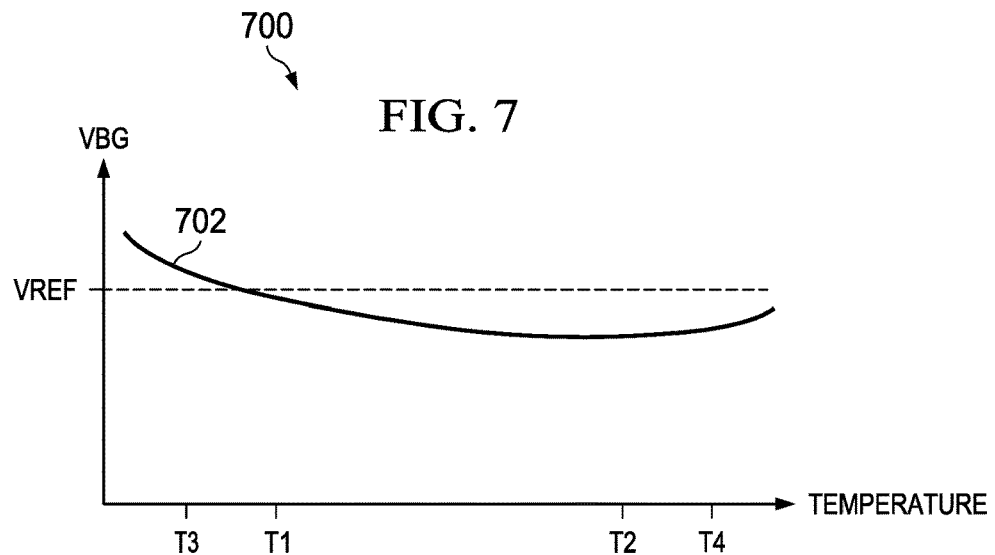
FIG. 7 is a signal diagram of an uncompensated bandgap reference circuit output voltage as a function of temperature.
Figure 8:
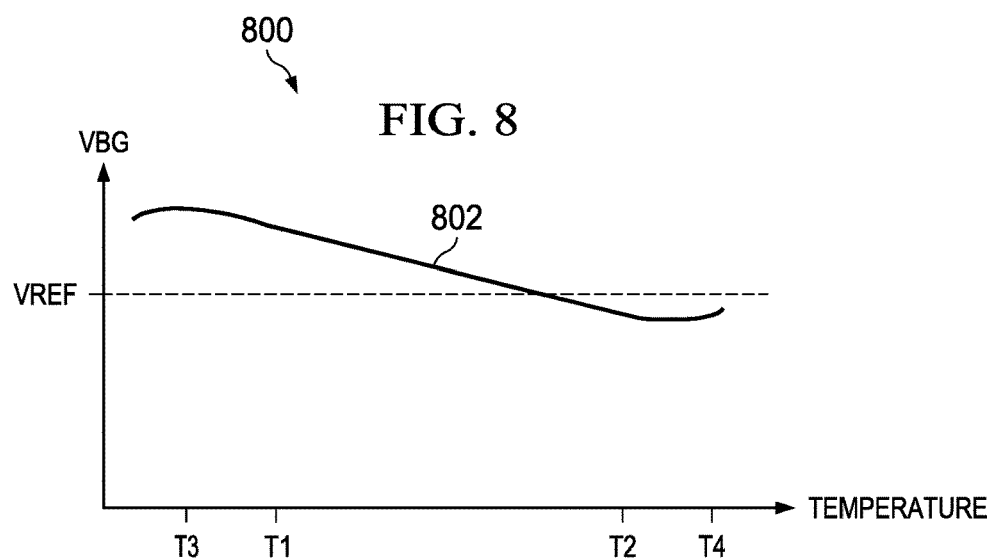
FIG. 8 is a signal diagram of a bandgap reference circuit output voltage as a function of temperature with fixed coefficient curvature correction.
Figure 9:
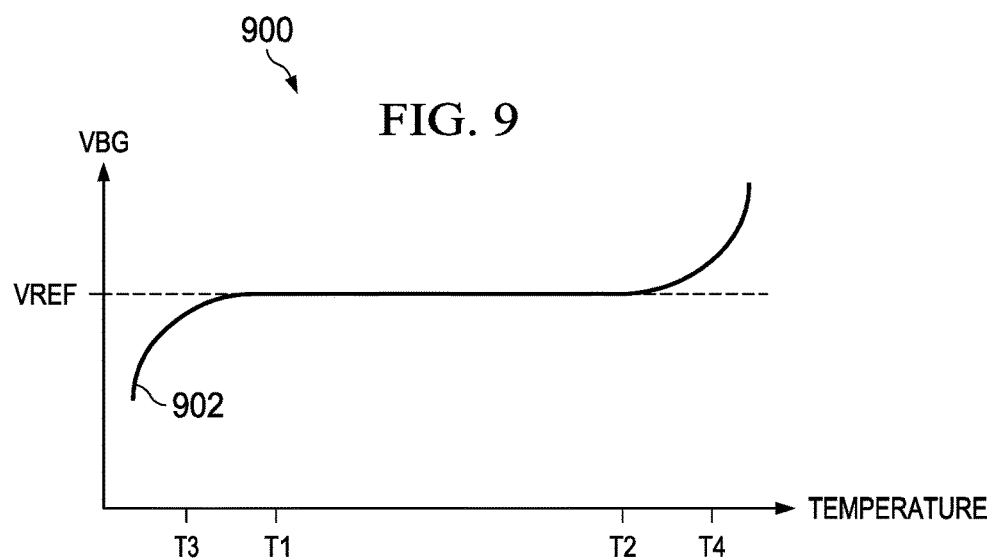
FIG. 9 is a signal diagram of a bandgap reference circuit output voltage as a function of temperature with variable coefficient two temperature trimming.

Referring also to FIGS. 7-9, FIG. 7 shows a graph 700 with an uncompensated bandgap reference circuit output voltage curve 702 (VBG) as a function of temperature throughout a temperature range from T3 (e.g., −25 degrees C.) to T4 (e.g., 125 degrees C.), including first and second prospective operating range points T1 (e.g., 25 degrees C.) and T2 (e.g., 90 degrees C.). As seen in the curve 702, the bandgap reference output voltage VBG can deviate significantly from the desired value VREF, and drifts over temperature. A graph 800 in FIG. 8 shows a bandgap reference circuit output voltage curve 802 as a function of temperature with fixed coefficient curvature correction (e.g., at 601 in FIG. 6 using the trim DAC 170 in FIG. 1). As seen in the curve 802, the curvature compensated bandgap reference output voltage VBG has a somewhat linear central portion with opposite polarity variations at and near the ends of the temperature range. A graph 900 in FIG. 9 shows a bandgap reference circuit output voltage curve 802 as a function of temperature with variable coefficient two temperature trimming (e.g., at 602 in FIG. 6 using the trim DAC 160 in FIG. 1). The two temperature compensation corrects the errors at or near the prospective knee temperatures T1 and T2 to improve tracking between VBG and VREF between T1 and T2, e.g., with opposite polarity variations below T1 and above T2.

Figure 10:
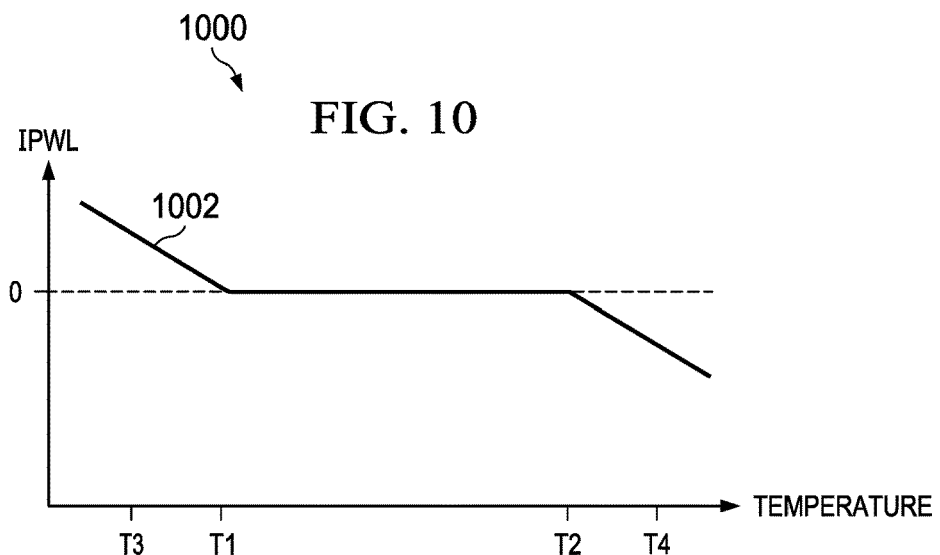
FIG. 10 is a signal diagram of a bandgap reference output voltage piecewise linear compensation current as a function of temperature.
Figure 11:
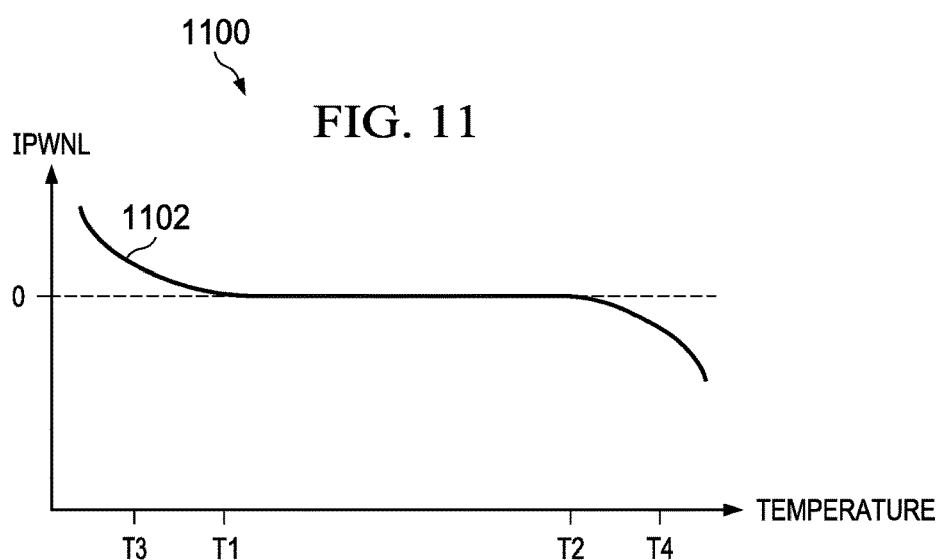
FIG. 11 is a signal diagram of a bandgap reference output voltage piecewise nonlinear compensation current as a function of temperature.
Figure 12:
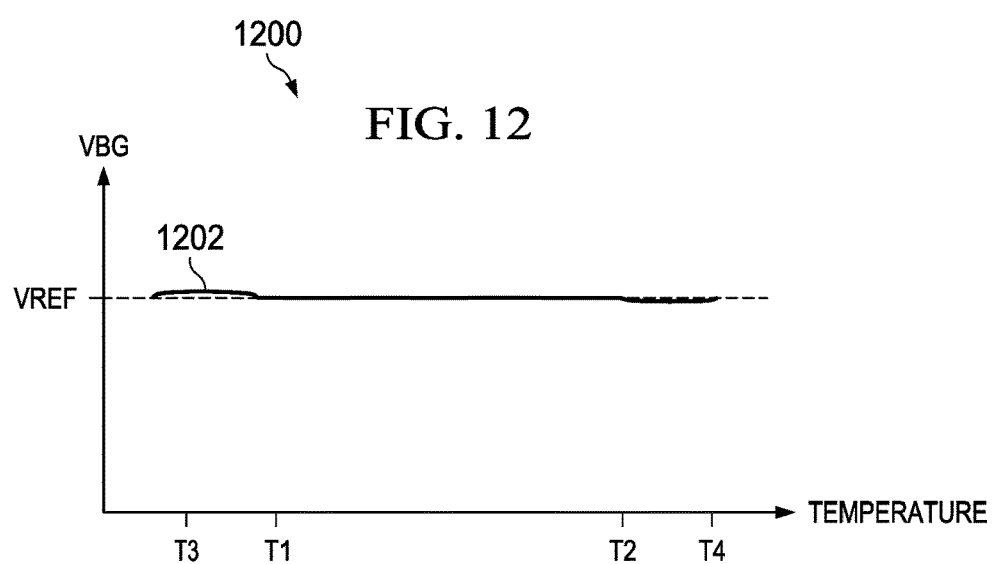
FIG. 12 is a signal diagram of a bandgap reference output voltage as a function of temperature with piecewise linear and nonlinear compensation.

FIGS. 10-12 illustrate piecewise compensation to further enhance the bandgap reference output voltage accuracy and reduce temperature drift effects. A graph 1000 in FIG. 10 shows a curve 1002 of bandgap reference piecewise linear compensation current IPWL as a function of temperature between T3 and T4 as in FIGS. 7-9 above. The knee points at T1 and T2 in this example coincide with the respective bend point temperatures of the bandgap circuit 102, and the piecewise linear compensation current IPWL includes linear portions below T1 and above T2 that counteract the opposite polarity variations at and near the ends of the temperature range of the lower order compensated output curve 902 of FIG. 9 above. A graph 1100 in FIG. 11 shows an example curve 1102 of the piecewise nonlinear compensation current IPWNL as a function of temperature. The curve 1102 provides nonlinear portions below T1 and above T2 that counteract the higher order aspects of the opposite polarity variations at and near the ends of the temperature range of the lower order compensated output curve 902 of FIG. 9. A graph 1200 in FIG. 12 shows a curve 1202 of the bandgap reference output voltage VBG as a function of temperature with piecewise linear and nonlinear compensation introduced by the respective compensation currents IPWL and IPWNL shown in the curves 1002 and 1102.

FIGS. 13-25 show examples of multi-device bandgap voltage output and compensation curves for multiple devices, such as devices 100 of a processed wafer at wafer probe testing, or multiple devices 100 in a batch of processed wafers, etc. A graph 1300 in FIG. 13 shows a group of curves 1302 representing the uncompensated bandgap reference circuit output voltages VBG for multiple reference generator circuits 102 throughout a temperature range from T3 (e.g., −25 degrees C.) to T4 (e.g., 125 degrees C.), including first and second prospective operating range points T1 (e.g., 25 degrees C.) and T2 (e.g., 90 degrees C.). As shown in the curves 1302, variations of the manufacturing process(es) lead to variation in the raw uncompensated output voltage VBG.

FIG. 14 shows a graph 1400 with curves 1402 of first and second order corrected bandgap reference output voltage as a function of temperature with a temperature drift bend point at a temperature T5 that is different (e.g., higher) than a fixed piecewise compensation knee temperature point T2. This example demonstrates silicon measurements having a bending point at 105 degrees C. (T5) and the error due to piecewise linear compensation provided at a lower fixed temperature of 90 degrees C. for 32 devices 100. A graph 1500 in FIG. 15 shows curves 1502 of piecewise linear and nonlinear compensated bandgap reference output voltage for multiple reference generator circuits 102 as a function of temperature with the temperature drift bend point T5 that is different than the fixed piecewise compensation knee point at T2.

Figure 16:
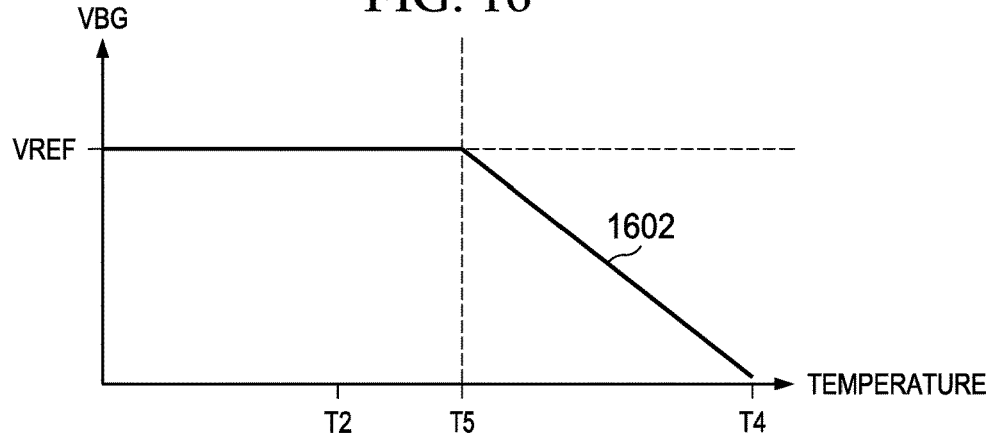
FIG. 16 is a signal diagram of a piecewise linear compensated bandgap reference circuit output voltage as a function temperature with a temperature drift bend point.
Figure 17:
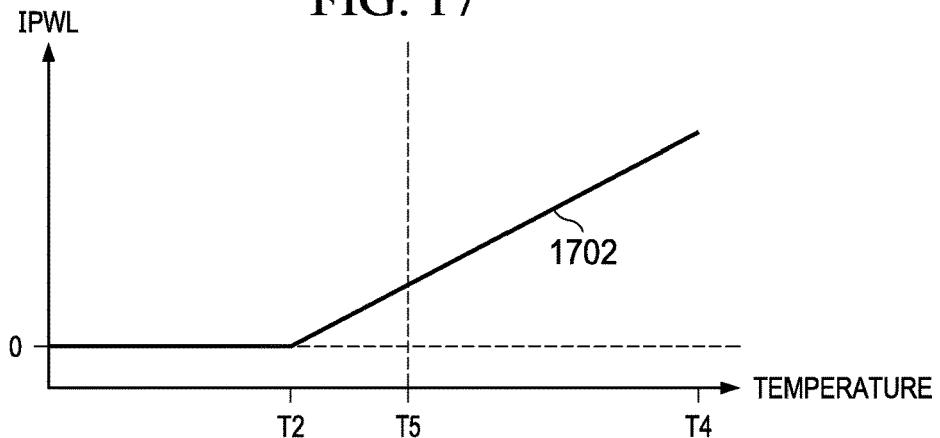
FIG. 17 is a signal diagram of a bandgap reference output voltage piecewise nonlinear compensation current as a function of temperature with a fixed piecewise compensation knee at a lower temperature than the temperature drift bend point of FIG. 16.
Figure 18:
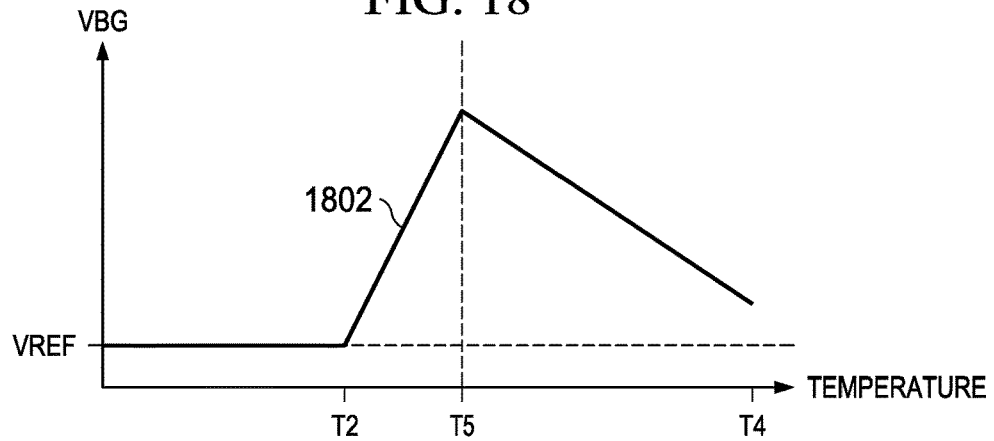
FIG. 18 is a signal diagram of piecewise linear and nonlinear compensated bandgap reference output voltage as a function of temperature with the temperature drift bend point of FIG. 16 different than the fixed piecewise compensation knee of FIG. 17.

FIGS. 16-18 demonstrate the higher order errors caused by mismatch between the actual device temperature drift bend point T5 and a different piecewise compensation knee point T2. The described example devices 100 allow adjustment for this situation by providing adjustable knee point temperature settings through the adjustment circuit(s) 123 of FIG. 1 as described above, and thus enable low drift, high accuracy reference device products 100 even when the bending point of temperature drift of a bandgap voltage in silicon or other semiconductor material varies from a fixed temperature. In this regard, the higher order components depend on design and process, and the bend point or temperature point of drift varies with design and with process. These higher order effects were not as critical in previous piecewise compensation approaches as device drift tolerances were wider, but now present a barrier to successful manufacture of high precision references with very tight thermal drift specifications (e.g., 1 ppm/C or less).

FIG. 16 shows a graph 1600 with a curve 1602 that represents one inflection region of a piecewise linear compensated bandgap reference circuit output voltage VBG as a function of temperature from below T2 through T4 as in the above discussion. This curve 1602 shows a bend or inflection point at T5, which is above T2. A graph 1700 in FIG. 17 shows the bandgap reference output voltage piecewise nonlinear compensation current curve 1702 (IPWL) as a function of temperature in this range, with a fixed piecewise compensation knee at a lower temperature T2 than the temperature drift bend point T5 of FIG. 16. A graph 1800 in FIG. 18 shows a curve 1802 of the piecewise linear and nonlinear compensated bandgap reference output voltage as a function of temperature with the temperature drift bend point T5 of FIG. 16 different than the fixed piecewise compensation knee at T2 in FIG. 17.

FIG. 19-21 show the advantages of adjusting the piecewise compensation knee to correspond more closely to the actual characterized thermal inflection or bend point temperature (T5) of the device. FIG. 19 shows a graph 1900 with a curve 1902 of piecewise linear compensated bandgap reference circuit output voltage as a function temperature with an adjusted temperature drift bend point closer to or at T5. The graph 2000 in FIG. 20 has a curve 2002 that shows a corresponding bandgap reference output voltage piecewise nonlinear compensation current IPWL with a piecewise compensation knee at a temperature T5 adjusted to the temperature drift bend point of FIG. 19. A curve 2102 of the resulting piecewise linear and nonlinear compensated bandgap reference output voltage VBG is shown in a graph 2100 of FIG. 21, in which the piecewise compensation knee of FIG. 20 is at a temperature adjusted to the temperature drift bend point of FIG. 19. The knee point adjustment thus addresses the higher order effects of mismatch between the temperature drift bend point T5 of the actual manufactured bandgap circuit 102 and a previously designated piecewise compensation knee at T2. Similar advantages are found for adjusting the lower knee point from T1 to more closely align with an actual device bend point. Moreover, further adjustment circuits may be used for additional knee or inflection points, for example, in compensation approaches that use more than three pieces or segments for piecewise temperature compensation.

Figure 22:
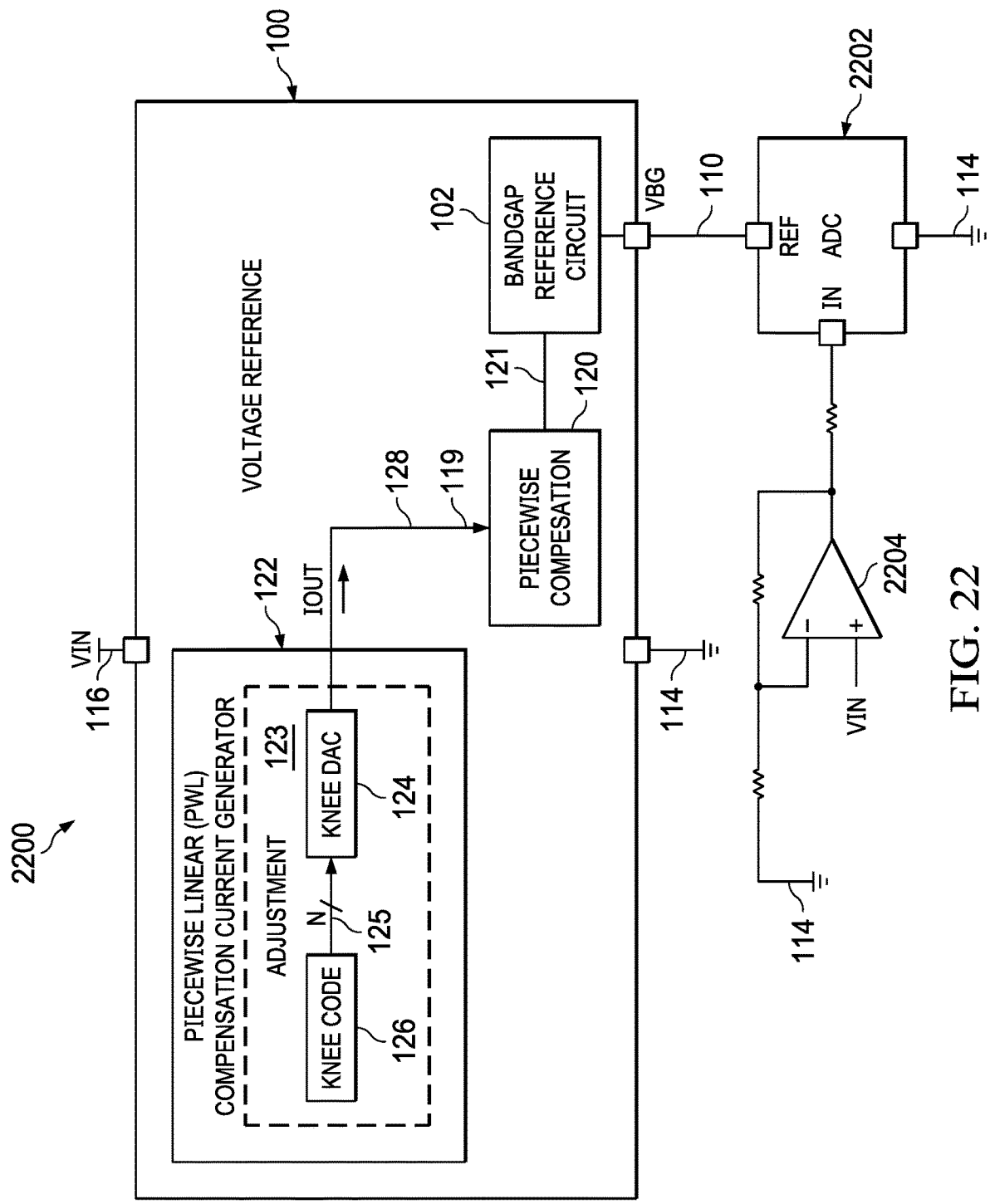
FIG. 22 is a schematic diagram of an analog to digital converter (ADC) system with an ADC converter using the voltage reference electronic device with the piecewise correction current generator circuit with a knee adjustment trim circuit of FIG. 1.

FIG. 22 shows an analog to digital converter (ADC) system 2200 with an ADC 2202 having a voltage reference input coupled to receive the output voltage signal VBG from the reference device 100 shown in FIG. 1 above. This example system 2200 also includes an input voltage buffer amplifier circuit with an amplifier 2204 to receive and buffer an input voltage VIN to be measured, and the output of the amplifier 2204 provides a conversion analog input to the ADC 2202 for conversion in relation to the reference voltage VBG.

Modifications are possible in the described examples, and other implementations are possible, within the scope of the claims.

What is claimed is:

1. An electronic device, comprising:
   a bandgap reference circuit having a bandgap output and a bandgap input;
   a compensation circuit having a compensation output and a compensation input, the compensation output coupled to the bandgap input; and
   a current generator having a current generator output coupled to the compensation input, the current generator comprising a knee point temperature adjustment circuit coupled to the current generator output.

2. The electronic device of claim 1, the knee point temperature adjustment circuit comprising a digital to analog converter (DAC) having a DAC output and a DAC input, the DAC output coupled to the current generator output.

3. The electronic device of claim 2, wherein the DAC is a current DAC configured to provide an analog compensation current signal to the current generator output.

4. The electronic device of claim 3, wherein the current DAC is configured to provide the analog piecewise compensation current signal with a knee point temperature according to a multi-bit knee point temperature code received at the DAC input.

5. The electronic device of claim 4, wherein the compensation circuit comprises:
   a first trim DAC a first trim DAC output configured to provide an analog piecewise linear compensation current signal to the compensation input based on the analog compensation current signal; and
   a second trim DAC having a second trim DAC output configured to provide an analog piecewise nonlinear compensation current signal to the output based on the analog compensation current signal.

6. The electronic device of claim 3, wherein the compensation circuit comprises a trim DAC having a trim DAC output configured to provide an analog piecewise linear compensation current signal to the compensation output based on the analog compensation current signal.

7. The electronic device of claim 6, wherein the trim DAC is a first trim DAC and the trim DAC output is a first trim DAC output, and wherein the compensation circuit comprises a second trim DAC having a second trim DAC output configured to provide an analog piecewise nonlinear compensation current signal to the compensation output based on the analog compensation current signal.

8. The electronic device of claim 2, wherein the DAC comprises:
   a first transistor and a first resistor coupled in series between a supply terminal and a bias terminal, the first transistor haivng a first control terminal configured to receive a first voltage signal; and a second transistor and a second resistor coupled in series between the supply terminal and the bias terminal, the second transistor having a second control terminal configured to recieve a second voltage signal;

the first voltage signal being proportional to a temperature or complementary to the temperature, and the second voltage signal being complementary to the first voltage signal.

9. The electronic device of claim 8, wherein the DAC comprises an output transistor coupled to the current generator output.

10. An electronic device, comprising:
a bandgap reference circuit;
a compensation circuit configured to provide a piecewise compensation signal to the bandgap reference circuit; and
current generator having a current generator output, the current generator configured to provide a piecewise compensation current signal to the compensation circuit, the current generator comprising
a knee point temperature adjustment circuit configured to set a knee point temperature of the piecewise compensation current signal.

11. The electronic device of claim 10, wherein the knee point temperature adjustment circuit comprises a digital to analog converter (DAC) having a DAC output coupled to the current generator output.

12. The electronic device of claim 11, wherein the DAC is a current DAC configured to provide an analog piecewise compensation current signal to the current generator output.

13. The electronic device of claim 12, wherein the current DAC is configured to provide the analog piecewise compensation current signal with a knee point temperature according to receiving a multi-bit knee point temperature code.

14. The electronic device of claim 13, wherein the compensation circuit comprises:
a first trim DAC configured to provide an analog piecewise linear compensation current signal based on the analog piecewise compensation current signal; and
a second trim DAC configured to provide an analog piecewise nonlinear compensation current signal based on the analog piecewise compensation current signal.

15. The electronic device of claim 12, wherein the compensation circuit comprises a trim DAC configured to provide an analog piecewise linear compensation current signal based on the analog piecewise compensation current signal.

16. The electronic device of claim 15, wherein the trim DAC is a first trim DAC and wherein the compensation circuit comprises a second trim DAC (144) (144) configured to provide an analog piecewise nonlinear compensation current signal based on the analog piecewise compensation current signal.

17. The electronic device of claim 11, wherein the DAC comprises:
a first transistor and a first resistor coupled in series with between a supply terminal and a bias terminal, the first transistor having a first control terminal configured to receive a first voltage signal; and
a second transistor and a second resistor coupled in series between the supply terminal and the bias terminal, the second transistor having a second control terminal configured to receive a second voltage signal;
the first voltage signal being proportional to a temperature or complementary to the temperature, the second voltage signal being complementary to the first voltage signal.

18. The electronic device of claim 17, wherein the DAC comprises an output transistor coupled to the current generator output.

19. A system, comprising:
an electronic circuit having a reference voltage input; and
a voltage reference circuit comprising:
a bandgap reference circuit having a bandgap output and a bias input, the bandgap output coupled to the reference voltage input;
a compensation circuit having a compensation circuit output and a compensation circuit input, the compensation circuit output coupled to the bias input; and
a current generator having a current generator output coupled to the compensation circuit input, the current generator comprising a knee point temperature adjustment circuit coupled to the current generator output.

20. The system of claim 19, wherein the knee point temperature adjustment circuit comprises a digital to analog converter (DAC) having a DC output coupled to the current generator output.

* * * * *